United States Patent [19]

Whight

[11] Patent Number: 4,707,719

[45] Date of Patent: Nov. 17, 1987

[54] SEMICONDUCTOR DEVICE HAVING AN ANNULAR REGION FOR IMPROVED VOLTAGE CHARACTERISTICS

[75] Inventor: Kenneth R. Whight, Cowfold, England

[73] Assignee: U.S. Philips Corporation, New York, N.Y.

[21] Appl. No.: 789,972

[22] Filed: Oct. 21, 1985

[30] Foreign Application Priority Data

Nov. 21, 1984 [GB] United Kingdom ............... 8429410

[51] Int. Cl.⁴ .................... H01L 27/02; H01L 29/34; H01L 29/40; H01L 29/04
[52] U.S. Cl. ....................................... 357/53; 357/51; 357/52; 357/59
[58] Field of Search ..................... 357/53, 52, 59 F, 51

[56] References Cited

U.S. PATENT DOCUMENTS 3,971,061 7/1976 Matsushita et al. ................... 357/52
4,567,502 1/1986 Nakagawa et al. .................... 357/52

FOREIGN PATENT DOCUMENTS 2131603 6/1984 United Kingdom ................. 357/52

Primary Examiner—Martin H. Edlow
Assistant Examiner—Robert P. Limanek

Attorney, Agent, or Firm—Robert T. Mayer; Steven R. Biren

[57] ABSTRACT

The breakdown voltage of a p-n junction operated under reverse bias in at least one mode of operation of a semiconductor device is increased by providing at least one annular region forming an auxiliary p-n junction within the spread of a depletion layer from the reverse-biased junction. A passivating dielectric layer with an overlying electrically resistive layer extends over the semiconductor body surface between the active device region forming the p-n junction and a surrounding region of the body portion located beyond the (outer) annular region. The resistive layer is connected to these regions but is insulated from the annular regions by the dielectric layer. A stable high breakdown voltage can be obtained by providing the resistive layer with conductive connection means at the or each annular area which overlies the annular region(s). The conductive connection means, which may be for example annular metal areas or annular highly-doped parts of the resistive layer, is more highly conductive than the resistance of adjacent parts of the resistive layer and provides an electrical connection between these adjacent parts so that a potential variation which corresponds approximately with that along the underlying semiconductor body surface (including the annular regions) can be obtained along the resistive layer.

6 Claims, 4 Drawing Figures

SEMICONDUCTOR DEVICE HAVING AN ANNULAR REGION FOR IMPROVED VOLTAGE CHARACTERISTICS

BACKGROUND OF THE INVENTION

This invention relates to semiconductor devices, for example rectifier diodes, field-effect transistors, bipolar transistors and thyristors, each having a p-n junction which is operated under reverse bias in at least one mode of operation of the device.

U.S. Pat. No. 4009483 describes a semiconductor device comprising a semiconductor body having a body portion of one conductivity type adjacent a major surface of the body, and an active device region of the oppposite conductivity type also adjacent said major surface and forming with said body portion a main p-n junction which is operated under reverse bias in at least one mode of operation of the device. At least one annular region of said opposite conductivity type is adjacent said major surface and extends around said active device region to form with said body portion an auxiliary p-n junction located within the spread of a depletion layer from the reverse-biased main p-n junction and thereby serving to increase the breakdown voltage of the main p-n junction. A passivating dielectric layer extends over an area of said major surface between the active device region and a surrounding region of the body portion which is located beyond said at least one annular region. An electrically resistive layer overlies the dielectric layer and is electrically connected to said active device region and to said surrounding region of the body portion via windows in the dielectric layer.

The annular region or regions forming the auxiliary p-n junctions increase the breakdown voltage of the main p-n junction by reducing the electric field in the depletion layer as it spreads to these regions. The annular regions act like a voltage divider for the reverse-bias voltage applied between the active device region and the body portion. The resistive layer electrically connected between the active device region and the body portion imposes a potential gradient over the surface of the underlying passivating dielectric layer to shield the passivating dielectric layer against the effects of external charges.

In most of the examples given in U.S. Pat. No. 4009483, the resistive layer is also connected to the annular regions at further windows in the dielectric layer so that the potential of the annular regions may be established by a voltage division effect caused by the leakage current flowing through the resistive layer. However, experiments performed in connection with the present invention have shown that connecting the resistive layer to the annular regions may often result in a reduction of the breakdown voltage, for example from 1000 volts to 600 volts. The precise mechanism or mechanisms responsible for this reduction are not fully known but appear to relate to the flow of leakage current between the annular region and the part of the resistive layer connected thereto.

Provided the resistance layer is connected to the body portion at a considerable distance beyond the (outermost) annular region, it appears that the potential distribution along the resistive layer can reinforce the reverse-biasing of the annular region(s) in the depletion layer. This tends to raise the potential of the annular region(s) so that only a small reverse leakage current is taken from the resistive layer which then seems to function as a voltage divider. However the need to provide this considerable distance beyond the (outermost) annular region may result in an undesirable increase in the semiconductor body surface area needed for the device.

The connection of the resistive layer to the body portion may be brought close to the (outermost) annular region, for example as illustrated in FIG. 2 of U.S. Pat. No. 4009483. In this situation, however, it appears from analyses performed by the present inventor that the potential distribution along the resistive layer will try to decrease the potential at which the annular region(s) would otherwise float in the depletion layer so that larger (even forward) currents may be taken from the resistive layer by the annular region(s). The current flow along the resistive layer may then become non-uniform so that undesirably different potential gradients may occur over the various lengths of the resistive layers resulting in less homogeneous electric fields across the dielectric layer and premature breakdown.

It is suggested at column 5, lines 31 to 46 of U.S. Pat. No. 4009483 that, if high leakage currents are anticipated for a particular manufactured device, it may be desirable to eliminate the contact between the resistive layer and the annular region(s). Such modified device structures have been fabricated in which the resistive layer is insulated from the annular region(s) by the dielectric layer extending continuously between the window where connection is made to the active device region and the window where connection is made to the outer surrounding region of the body portion. In general these devices were found to have breakdown voltages which were higher, although generally still slightly less than what was expected given the resistivity of the body portion, the number of annular regions and the dimensions and other parameter values chosen for the design of the device. As its intermediate connections have been eliminated, the potential along the resistive layer no longer depends on its conductivity and a constant current flows along the length of the resistive layer. However it is found that during the first few seconds after application of the reverse-voltage the breakdown voltage is slightly lower than the final value achieved, e.g. increasing from an initial 1000 volts to about 1200 volts with particular device structures designed for operation up to such voltage levels. The present inventor believes that this effect may result from a significant degree of mismatch between the uniform potential variation along the resistive layer and the non-uniform potential variation along the semiconductor body surface including the annular region(s). This potential mismatch is thought to produce high vertical fields through the intermediate dielectric layer resulting in local charging of the dielectric layer. The effect is found to be particularly problematic with wide closely-spaced annular regions such as may be used, for example, adjacent the active device region in accordance with the teaching in co-pending European patent application No. 83.201681.0.

SUMMARY OF THE INVENTION

According to the present invention a semiconductor device comprising a semiconductor body having a body portion of one conductivity type adjacent a major surface of the body, an active device region of the opposite conductivity type also adjacent said major surface and forming with said body portion a main p-n junction which is operated under reverse bias in at least one mode of operation of the device, at least one annular region of said opposite conductivity type adjacent said major surface and extending around said active device region to form with said body portion an auxiliary p-n junction located within the spread of a depletion layer from the reverse-biased main p-n junction and thereby serving to increase the breakdown voltage of the main p-n junction, a passivating dielectric layer which extends over an area of said major surface between the active device region and a surrounding region of the body portion which is located beyond said at least one annular region, and an electrically resistive layer overlying the dielectric layer and being electrically connected to said active device region and to said surrounding region of the body portion via windows in the dielectric layer, said resistive layer being insulated by the dielectric layer from said at least one annular region, is characterized in that, at the (or each) annular area which overlies the at least one annular region, the resistive layer is provided with conductive connection means which is more highly conductive than the resistance of adjacent parts of the resistive layer and which provides an electrical connection between said adjacent parts of the resistive layer.

By providing the resistive layer with such conductive connection means the problems due to a significant potential mismatch between the resistive layer and the underlying semiconductor body surface can be avoided. Thus, the potential gradient in the resistive layer can be at least mainly contained in the intermediate areas which overlie the surface areas of the body portion between the annular regions (if there is more than one such annular region) and between the active device region and the (inner) annular region and beyond the (outer) annular region. The (or each) annular region forms an annular surface area of substantially equipotential, and the overlying conductive connection means may therefore provide a similar annular area of substantially equipotential associated with the resistive layer. In this way a good correspondence may be obtained between the potential distribution along both the resistive layer and the underlying semiconductor body surface, even when wide closely-spaced annular regions are present.

The conductive connection means may be formed in a variety of ways by quite different technologies. It may be an integral part of the resistive layer or provided as a different layer. Thus, in one form, said conductive connection means is a part of said resistive layer which has a greater thickness than the adjacent parts of the resistive layer. In another form, said resistive layer comprises semiconductor material which is rendered more highly conductive by doping at the (or each) said annular area so as to provide said conductive connection means. In a further form, said conductive connection means are annular metal areas which are in contact with the resistive layer. These annular metal areas may be provided over or under parts of the resistive layer or even inbetween the adjacent parts of the resistive layer.

It should be noted that it is already known from United Kingdom Pat. No. (GB-A) 1260618 to vary the thickness of a resistive layer overlying a passivating dielectric layer in order to obtain a predetermined resistance drop along the resistive layer. FIG. 3 of GB-A No. 1260618 shows its thickness decreasing stepwise with distance along the resistive layer 11 from the p-n junction 9. FIGS. 4 and 5 show annular metal areas 13b and 13c combined with resistive layer 12 or 15 to obtain a more uniform potential distribution in all annular directions along the resistive layer.

There is no teaching in GB-A No. 1260618 to suggest that annular regions of the opposite conductivity type may additionally be provided in the semiconductor body portion around the p-n junction, and these resistive layer arrangements disclosed in GB-A No. 1260618 are not suitable for combination with such annular regions in devices in accordance with the present invention. Thus, for example, the inner annular metal area 13b in FIGS. 4 and 5 is located over the area of the body portion immediately adjoining the p-n junction, and so these metal areas would not overlie any annular regions of the opposite conductivity type even if such annular regions were to be provided.

BRIEF DESCRIPTION OF THE DRAWING

Features in accordance with the invention will be illustrated more specifically in embodiments of the invention now to be described, by way of example, with reference to the accompanying diagrammatic drawings, in which.

Figure 1:
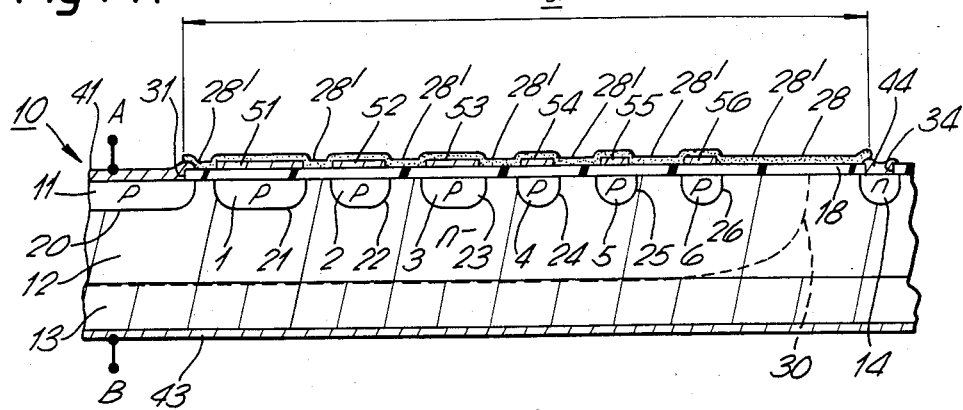
FIGS. 1 to 3 are cross-sectional views of similar parts of a semiconductor body of three different devices in accordance with the invention.
Figure 2:
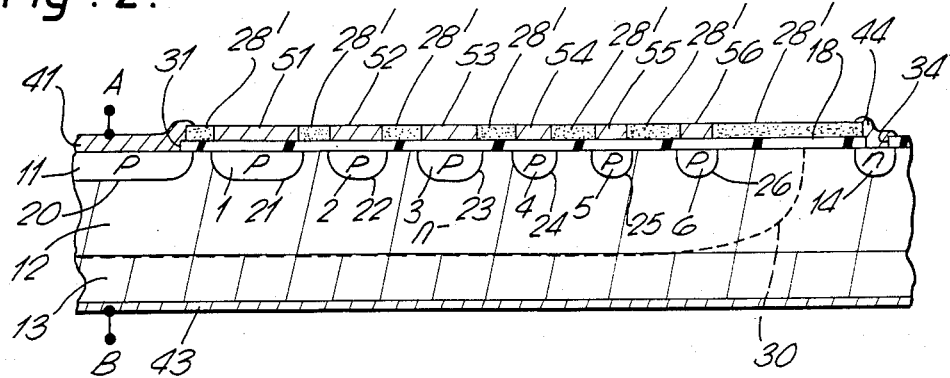
Figure 3:
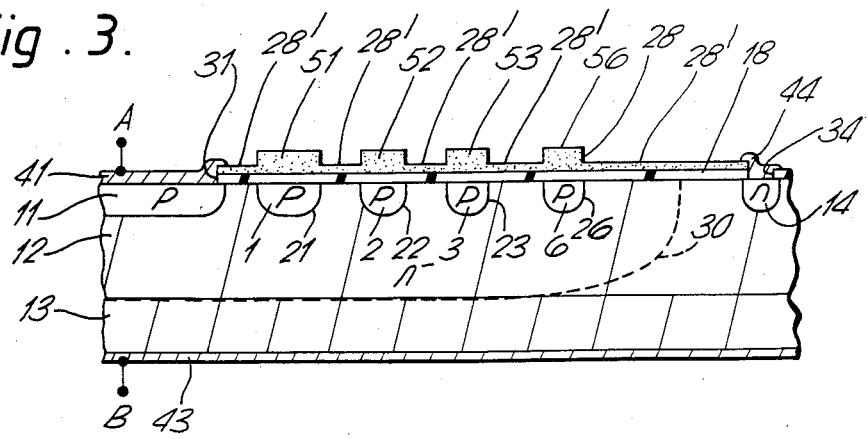
Figure 4:
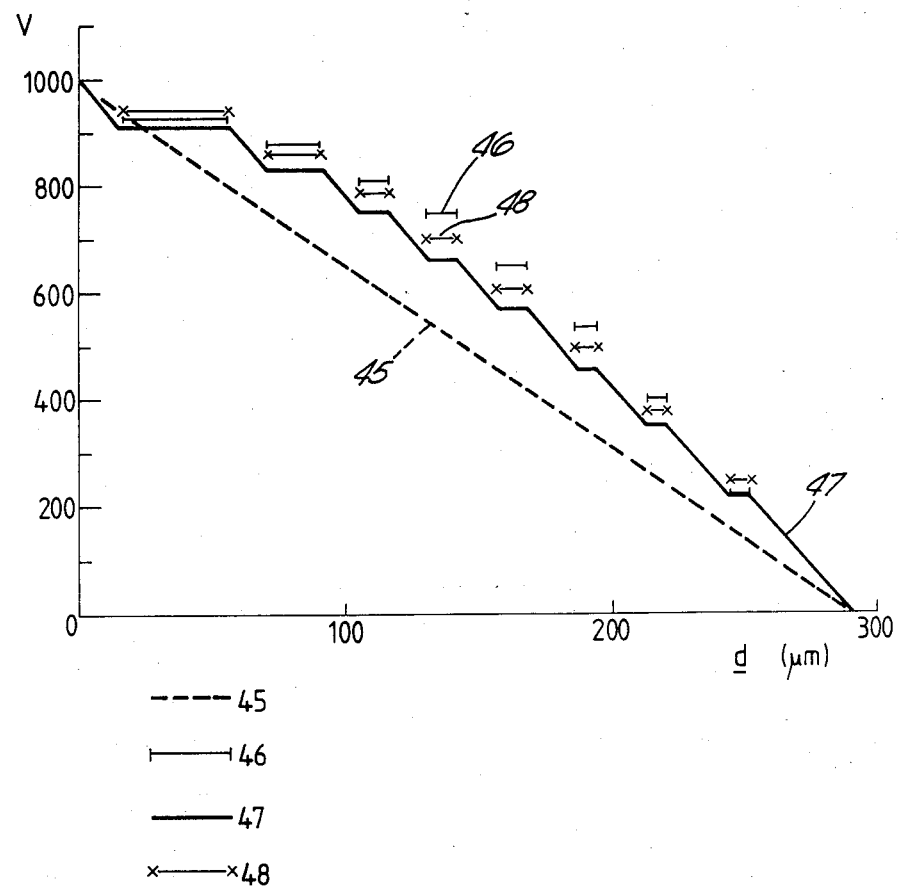
FIG. 4 is a representation of the variation of potential V with distance d along the resistive layer and the extent of the equipotentials of the annular regions at the underlying semiconductor body surface in such a semiconductor device.

It should be noted that FIGS. 1 to 3 are not drawn to scale; the relative dimensions and proportions of parts of these FIGURES (particularly in the direction of thickness) have been shown exaggerated or diminished for the sake of clarity and convenience in the drawings. The same reference signs as used in one embodiment are generally used when referring to corresponding or similar parts in the other embodiments. It should also be noted that the graph of FIG. 4 is based on calculations using a simplified computer model and involving assumptions about the magnitude of certain common parameters and so merely illustrates relative changes in potential V, rather than illustrating absolute magnitudes.

DESCRIPTION OF THE PREFERRED EMBODIMENTS

The semiconductor device of FIG. 1 comprises a semiconductor body 10 (for example of monocrystalline silicon) having a portion 12 of one conductivity type (n type, in the example shown in the drawing) which adjoins the upper major surface of the body 10. An active device region 11 of the opposite conductivity type (p type, in the example shown) also adjoins said upper major surface and forms with the body portion 12 a main p-n junction 20 which extends to the upper major surface. The junction 20 is operated in reverse-bias in at least one mode of operation of the device, by applying a bias voltage between the connections A and B in FIG. 1.

Concentric annular regions 1 to 6 of said opposite conductivity type (p type, in the example) extend around the active device region 11. These annular regions 1 to 6 also adjoin the upper major surface and form with the body portion 12 auxiliary p-n junctions 21 to 26 located within the spread of a depletion layer 30 from the reverse-biased main p-n junction 20 so as to increase the breakdown voltage of the main junction 20.

In FIG. 1 an example of a depletion layer 30 is shown as extending across the thickness of the body portion 12, although in some cases the depletion layer 30 may not extend so deeply from the junction 20.

A passivating dielectric layer 18 extends over an area of the upper major surface between the active device region 11 and a surrounding region 14 of the body portion 12 which is located beyond the annular regions 1 to 6. An electrically resistive layer 28 overlies the dielectric layer 18 and is electrically connected to the active device region 11 and to the surrounding region 14 of the body portion 12 via windows 31 and 34 in the dielectric layer 18. The resistive layer 28 is insulated by the dielectric layer 18 from the annular regions 1 to 6.

The active device region 11 and annular regions 1 to 6 are more highly doped than the body portion 12 and may be formed by locally implanting or/and diffusing dopant of the oppposite conductivity type (p type) to locally overdose the body portion 12. The insulating passivating layer 18 may be of, for example, silicon dioxide and may be formed by thermally oxidizing the semiconductor body surface or by depositing a layer on the surface. The resistive layer 28 may comprise semiconductor material deposited under such conditions as to obtain a desired resistance in the layer 28 in accordance with desired level of leakage current along the layer 28. Thus, for example, the layer 28 may be of, for example, amorphous silicon undoped polycrystalline silicon or oxygen-doped polycrystalline silicon.

Metal electrodes 41 and 44, for example of aluminum, may be present at the contact windows 31 and 34 of the dielectric layer 18 to connect the resistive layer 28 to the regions 11 and 14 respectively. The region 14 may merely be an area of the body portion 12 having the same doping concentration as the bulk of the body portion 12. However, the region 14 is preferably a highly doped channel-stopper region of the same conductivity type as the body portion 12. This channel-stopper region 14 extends in a concentric arrangement around the system of regions 1 to 6 and is formed by local dopant introduction in a separate step from the regions 11 and 1 to 6.

The annular regions 1 to 6 and 14 may be circular rings which have circular symmetry around the active device region 11 at the upper major surface of the body 10. However, other geometrical outlines are possible, depending on the outline of the active device region 11 and the type of the device. Thus, for example the region 11 may have a square outline with straight sides but with rounded corners and the concentric rings 1 to 6 and 14 may be similarly square with straight sides and rounded corners. Such different outlines and geometries are already known in the power semiconductor device art and so will not be described further in the present specification. For convenience and simplicity in the drawing, FIG. 1 merely shows a cross-section through part of the annular region structure 1 to 6 and 14 at the right-hand side of the active device region 11.

The basic device structure of FIG. 1 may be used for various types of semiconductor devices in accordance with the invention, for example a power rectifier diode, a high voltage bipolar transistor, a thyristor, or a high voltage insulated-gate field-effect transistor.

In the case of a power rectifier diode, the p-n junction 20 may constitute the rectifying junction, metal layers forming the electrodes 41 and 43 constitute the diode terminals, and the body portion 12 may be a high resistivity n type substrate into which highly-doped n type layer 13 is diffused at the lower major surface and into which the p type regions 11, 1 to 6 are diffused at the upper major surface. However the rectifying junction of a power rectifier diode in accordance with the invention may be formed by a metal-semiconductor Schottky contact to the body portion 12, and this Schottky junction may be bounded at its periphery by an annular guard region 11.

In the case of an insulated-gate field-effect transistor, the p-n junction 20 may constitute the drain junction formed by an annular p type drain region 11 which extends around a central p type source region and an intermediate channel region of the transistor, and the body portion 12 may be a high resistivity n type epitaxial layer on a highly-doped n type substrate 13 to which the p type source region may be short-circuited in known manner.

In the case of a bipolar transistor, the p-n junction 20 may constitute a base-collector junction of the transistor, the region 11 being a p type base region which is provided in a high resistivity n type epitaxial layer 12 on a highly-doped n type substrate 13. The electrodes 41 and 44 are base and collector terminals respectively of the transistor, and at least one highly-doped n type emitter region having its own electrode is provided in the base region 11. However, the main p-n junction 20 may even be one blocking junction of a thyristor structure. In this latter case, the FIG. 1 structure is modified to have for example a high resistivity n type substrate 12 into which p type regions 11 and 13 may be diffused to form two oppositely-located blocking p-n junctions, the p type region 13 constituting the anode of the thyristor while an n type cathode emitter is provided in the p type base region 11.

The series of concentric annular regions 1 to 6 serves to increase the breakdown voltage of the p-n junction 20 by widening the spread of the depletion layer 30 along the body surface so as to reduce the associated electrostatic field adjacent the surface to a value less than that of the critical field for electron-hole pair generation by avalanche breakdown. The precise number, widths and spacings of the annular regions depend on the desired breakdown voltage and the depths of the regions, and these are chosen as appropriate to the type of device. Thus, although six regions 1 to 6 are shown in FIG. 1, one single deep annular region (1) may be sufficient for some devices in accordance with the invention, especially for lower voltage operation.

The resistive layer 28 electrically connected between the device region 11 and the body portion 12 imposes a potential gradient over the surface of the underlying dielectric layer 18. This shields the dielectric layer 18 from the effects of external charges. The magnitude of the potential difference over the length of the resistive layer 28 is determined by the voltage applied between the connections A and B. Because the layer 28 is insulated from the annular regions 1 to 6, the leakage current flowing in the resistive layer 28 is constant along the length of the resistive layer 28.

In accordance with the present invention, at each annular area which overlies the annular regions 1 to 6, the resistive layer 28 is provided with conductive connection means 51 to 56 each of which is more highly conductive than the resistance of adjacent parts 28 of the resistive layer 28 and provides an electrical connection between said adjacent parts 28' of the resistive layer.

In the form illustrated in FIG. 1, these conductive connection means 51 to 56 are annular metal areas in contact with the resistive layer 28. The annular metal areas 51 to 56 may be provided by the same metal deposition and definition steps as the electrode connections 41 and 44. In the particular arrangement shown in FIG. 1 the metal areas 51 to 56 were deposited before the resistive layer 28 so as to lie between the layers 18 and 28. However the metal areas 51 to 56 may be deposited on the resistive layer 28 in a subsequent manufacturing step.

Another form is illustrated in FIG. 2 in which the resistive layer 28 comprises semiconductor material (for example, one of the previously described silicon materials) which is rendered more highly conductive by doping (e.g. n type) at the annular areas overlying the regions 1 to 6 so as to provide the conductive connection means 51 to 56. This localized doping of the layer 28 may be effected in the same processing steps as may be used to provide a highly-doped region 14, or it may be effected in separate steps. FIG. 3 illustrates a further form of conductive connection means 51 to 56 as parts of the resistive layer 28 which have a greater thickness than the adjacent parts 28' of the resistive layer. This may be obtained by etching or otherwise thinning areas 28' of a thick layer 28.

In order to ensure that (with the processing tolerance in any given manufacturing process) the conductive connection means 51 to 56 do not extend to any great extent beyond the annular regions 1 to 6 which they overlie, it may be preferable to design the conductive connection means 51 to 56 with a width slightly smaller than the width of the underlying annular region.

Very good equipotential areas can be established over the annular regions 1 to 6 by providing the annular metal areas 51 to 56 (FIG. 1). In general, the highly-doped areas 51 to 56 of the resistive layer 28 of FIG. 2 will be less highly conductive than the metal areas 51 to 56 of FIG. 1, but nevertheless these doped areas 51 to 56 of FIG. 2 can still establish areas of substantially equipotential areas over the annular regions 1 to 6. In general, conductive connection means 51 to 56 formed by thick parts of the resistive layer 28 as in FIG. 3 will be even less highly conductive so that in this case there may occur along each of the thick parts 51 to 56 a potential gradient which U will nevertheless be small compared with the potential gradient along each of the adjacent parts 28' of the layer 28. In order to obtain at least approximately equipotentials in the areas 51 to 56 as compared with the potential gradients in the adjacent parts 28', the resistance of the adjacent parts 28' should be significantly larger, e.g. more than ten times that of the conductive connection means 51 to 56, and should preferably be as large as possible for a given manufacturing technology, for example at least 100 times or even more. The precise resistance values with the particular materials chosen depend, of course, not only on their resistivity but also on the dimensions of the parts in the directions of length, thickness and annular perimeter.

FIG. 4 illustrates how, by providing such conductive connection means 51 to 56, the potential distribution along the resistive layer 28 can be made to correspond closely with that along the underlying semiconductor body surface, even when wide closely-spaced annular regions (for example regions 21, 22 and 123) are present. FIG. 4 is based on a computer model of a device having eight annular regions 21 etc. and eight corresponding conductive connection means 51 etc. and operating with a reverse-bias voltage of 1000 volts applied across the p-n junction 20. In FIG. 4 (as in FIGS. 1 to 2), the inner annular regions (21, 22 and 23 in FIGS. 1 to 2) and their overlying conductive connection means (51, 52 and 53) are wider and more closely spaced than the outer annular regions (5 and 6) and their conductive connection means (55 and 56).

Four types of line representation 45 to 48 are employed in FIG. 4. The bar-ended lines 46 represent the extent of the equipotentials of the annular regions 1 etc. at the semiconductor body surface, calculated assuming a perfectly reflecting boundary condition at the upper surface of the dielectric layer 18. The broken line 45 is the potential gradient which would occur along an overlying resistive layer in the absence of the conductive connection means 51 etc. As can be seen there is a considerable mismatch between the lines 45 and 46, and this mismatch would result in high vertical fields locally across the dielectric layer 18, particularly at the outer edges of the inner annular regions 1, 2, 3, etc. The continuous line 47 illustrates the potential variations achieved along the resistive layer 28 by including the conductive connection means 51 etc. at the areas overlying the annular regions 1 etc., while the cross-ended lines 48 illustrate the equipotentials of the annular regions 1 etc. in this situation (i.e. calculated assuming the potential variation 47 along the upper surface of the dielectric layer 18). As can be seen there is a close matching between the lines 47 and 48. Because line 47 is also a good match with lines 46, the design procedure for the device can now be simplified by assuming reflecting boundary conditions.

The conductive connection means 51 etc. constitute substantially equipotential areas over the equipotential areas of the annular regions 1 etc., and the potential gradient in the resistive layer 28 is confined to the adjacent areas 28' which overlie the surface areas of the body portion 12 between each of the regions 11, 1 to 6 and 14. A more stable breakdown voltage is found to result, even during the initial few seconds of applying the reverse-bias voltage across the junction 20.

It will be evident that many modifications are possible within the scope of this invention. Thus, for example, the present invention may be used with annular regions having portions of different depth, for example as described in co-pending European patent application No. 84.200084.6. Different materials may be used for the layers 18 and 28 and for the conductive connection means 51 to 56. It will also be evident that the conductivity types of all the regions of the devices shown in the drawings may be reversed to form opposite conductivity type devices. Furthermore semiconductor materials other than silicon may be used for the devices, although allowance must then be made for different critical field strengths for avalanche breakdown in such other semiconductor materials.

I claim:

1. A semiconductor device comprisng a semiconductor body having a major surface and a body portion of one conductivity type adjacent said major surface of the body, an active device region of the opposite conductivity type also adjacent said major surface and forming with said body portion a main p-n junction which is operated under reverse bias in at least one mode of operation of the device, at least one annular region of said opposite conductivity type adjacent said major surface and extending around said active device region to form with said body portion an auxiliary p-n junction located within the spread of a depletion layer from the reverse-biased main p-n junction and thereby serving to increase the breakdown voltage of the main p-n junction, a passivating dielectric layer which extends over an area of said major surface between the active device region and a surrounding region of the body portion which is located beyond said at least one annular region, said dielectric layer having windows at the area of said active device region and said surrounding region, and an electrically resistive layer overlying the dielectric layer and being electrically connected to said active device region and to said surrounding region of the body portion via said windows in the dielectric layer, said resistive layer being insulated by the dielectric layer from said at least one annular region, at least one annular area which overlies said at least one annular region, the resistive layer at said at least one annular area being provided with conductive connection means which is at least about 10 times more highly conductive than the resistance of adjacent parts of the resistive layer and which provides an electrical connection between said adjacent parts of the resistive layer.

2. A device as claimed in claim 1, wherein said conductive connection means comprises a part of said resistive layer which has a greater thickness than the adjacent parts of the resistive layer.

3. A device as claimed in claim 1, that said resistive layer comprises semiconductor material which is rendered more highly conductive by doping at at least one annular area so as to provide said conductive connection means.

4. A device as claimed in claim 1, wherein said conductive connection means comprises an annular metal area in contact with the resistive layer.

5. A device as claimed in claim 1, wherein the resistance of said adjacent parts of the resistive layer is at least 100 times that of the conductive connection means.

6. A device as claimed in claim 1, 2, 3, 4 or 5 wherein inner annular regions of a plurality of said annular regions and the conductive connection means overlying said inner annular regions are wider and more closely spaced than outer annular regions and the conductive connection means overlying said outer annular regions.

* * * * *

UNITED STATES PATENT AND TRADEMARK OFFICE
CERTIFICATE OF CORRECTION

PATENT NO. : 4,707,719
DATED : November 17, 1987
INVENTOR(S) : Kenneth R. Whight It is certified that error appears in the above-identified patent and that said Letters Patent is hereby corrected as shown below:

<u>IN THE CLAIMS</u>

Claim 1, line 21    change "resitive" to --resistive--

Claim 3, line 1     change "that" to --wherein--

Signed and Sealed this

Nineteenth Day of December, 1989

Attest:

JEFFREY M. SAMUELS

*Attesting Officer*   *Acting Commissioner of Patents and Trademarks*